United States Patent
LeClerc

(10) Patent No.: US 10,126,362 B2
(45) Date of Patent: Nov. 13, 2018

(54) CONTROLLING A TEST RUN ON A DEVICE UNDER TEST WITHOUT CONTROLLING THE TEST EQUIPMENT TESTING THE DEVICE UNDER TEST

(71) Applicant: INTERNATIONAL BUSINESS MACHINES CORPORATION, Armonk, NY (US)

(72) Inventor: Steve L. LeClerc, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 748 days.

(21) Appl. No.: 14/570,082

(22) Filed: Dec. 15, 2014

(65) Prior Publication Data

US 2016/0169973 A1 Jun. 16, 2016

(51) Int. Cl.
 *G01R 31/317* (2006.01)
(52) U.S. Cl.
 CPC . *G01R 31/31724* (2013.01); *G01R 31/31718* (2013.01); *G01R 31/31712* (2013.01)
(58) Field of Classification Search
 CPC ............................................... G01R 31/31718
 See application file for complete search history.

(56) References Cited

U.S. PATENT DOCUMENTS

| | | |
|---|---|---|
| 5,892,949 A | 4/1999 | Noble |
| 6,216,196 B1 * | 4/2001 | Elwell ............... G06F 13/362 709/223 |
| 6,882,950 B1 | 4/2005 | Jennion et al. |
| 7,139,949 B1 | 11/2006 | Jennion et al. |
| 7,430,486 B2 | 9/2008 | Elston et al. |
| 7,461,407 B2 | 12/2008 | Little et al. |
| 7,900,064 B2 | 3/2011 | Cruzado et al. |
| 8,427,193 B1 | 4/2013 | Trimberger |

(Continued)

FOREIGN PATENT DOCUMENTS

EP 0410502 B1 5/1997

OTHER PUBLICATIONS

U.S. Appl. No. 14/831,807, filed Aug. 20, 2015, In re LeClerc, 48 pages.

(Continued)

*Primary Examiner* — Manuel A Rivera Vargas
(74) *Attorney, Agent, or Firm* — Tihon Poltavets; Amy J. Pattillo

(57) ABSTRACT

A test controller controlled by a design entity sends at least one closed type command of a closed loop architecture test flow to an arbiter of a vendor test platform controlled by a vendor entity, wherein the test controller controls nondeterministic testing on a protected integrated circuit (IC) integrated into an electronic assembly, as performed by test equipment hardware within the vendor test platform, without the design entity disclosing an underlying design of the protected IC to the vendor entity. In response to the test controller receiving at least one response of the at least one closed type command, from the arbiter interface passing the at least one closed type command directly through the test equipment hardware to the protected IC, determining, by the test controller, based on the at least one response, a next at least one closed type command of the closed loop architecture test flow to send to the arbiter.

11 Claims, 8 Drawing Sheets

(56) References Cited

U.S. PATENT DOCUMENTS

| | | |
|---|---|---|
| 8,566,660 B2 | 10/2013 | Taylor et al. |
| 8,626,460 B2 | 1/2014 | Kaufman et al. |
| 2011/0010720 A1 | 1/2011 | Smith et al. |
| 2011/0184688 A1* | 7/2011 | Uetake .................. G11C 29/40 |
| | | 702/120 |
| 2012/0096204 A1* | 4/2012 | Auerbach ............. G06F 13/364 |
| | | 710/244 |
| 2015/0089289 A1 | 3/2015 | Gahol |

OTHER PUBLICATIONS

"List of IBM Patents or Patent Applications Treated as Related", 2 pages.
JTAG Boundary Scan Test Systems (IEEE 1149.1), accessed via the Internet from <http://www.xjtag.com/support-jtag/jtag-high-level-guide.php> as of Oct. 23, 2014, 4 pages.
Non-final Office Action, dated Aug. 29, 2017, U.S. Appl. No. 14/831,807, filed Aug. 20, 2015, In re Leclerc, 31 pages.
Final Office Action, dated Jun. 1, 2018, U.S. Appl. No. 14/831,807, filed Aug. 20, 2015, In re Leclerc, 32 pages.

* cited by examiner

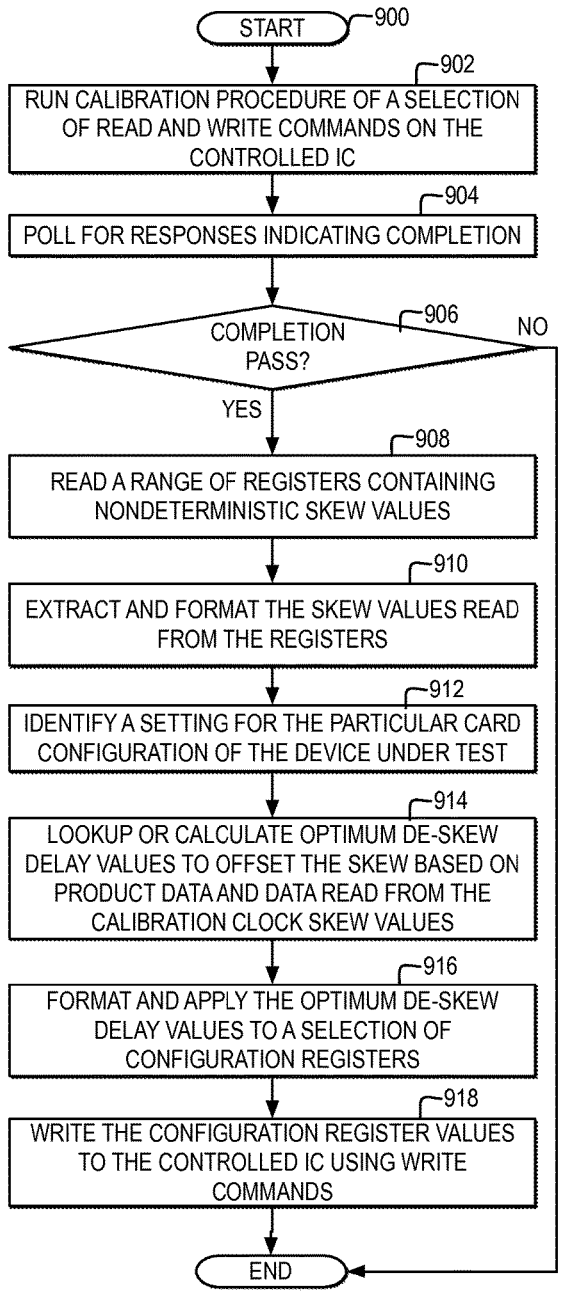
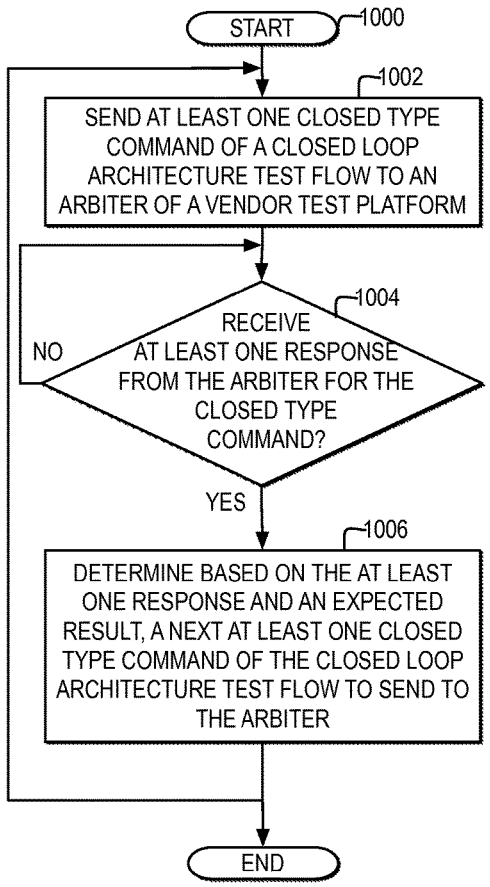
FIGURE 9
FIGURE 10

CONTROLLING A TEST RUN ON A DEVICE UNDER TEST WITHOUT CONTROLLING THE TEST EQUIPMENT TESTING THE DEVICE UNDER TEST

1. TECHNICAL FIELD

The embodiment of the invention relates generally to testing manufactured devices and particularly to controlling testing of a device under test without controlling the test equipment testing the device under test.

2. DESCRIPTION OF THE RELATED ART

Many electronic card assemblies, when manufactured, incorporate one or more integrated circuit (IC) chips that are embedded into or attached to a base, such as a printed circuit board (PCB). Test equipment is used to run tests on manufactured card assemblies.

BRIEF SUMMARY

Electronic card assembly may include one or more ICs integrated into the electronic assembly where an entity that controls the underlying design of the ICs prefers not to disclose the underlying design to the vendor entity that is responsible for testing the electronic assembly. Testing a complex IC integrated into an electronic assembly may require nondeterministic, closed loop testing, where specifying nondeterministic, closed loop testing requires a knowledge of the underlying design of the ICs. There is a need for a method, system, and computer program product for one entity to control the test run on a device under test without controlling the test equipment testing the device under test.

In another embodiment, a system for testing a device under test comprises a processor, coupled with a memory, and configured to perform the actions of sending, by a test controller controlled by a design entity, at least one closed command of a closed loop architecture test flow, to an arbiter of a vendor test platform controlled by a vendor entity, wherein the test controller controls testing of the closed loop architecture test flow on a protected integrated circuit (IC) integrated into an electronic assembly, as performed by test equipment hardware within the vendor test platform, wherein an input and output of the closed loop architecture test flow are nondeterministic, wherein the at least one closed command does not disclose an underlying design of the protected IC to the vendor entity. The system is configured to perform the actions of controlling, by the design entity, the closed loop architecture test flow for testing the protected IC integrated into the electronic assembly under test, such that the design entity controls running the at least one closed command sent by the closed loop architecture test flow, on the test equipment hardware, without disclosing the underlying design of the protected IC to the vendor entity, wherein the design entity discloses an arbiter specification to the vendor entity comprising an instruction for passing the at least one closed command to a secondary communication interface of the protected IC without interpretation, wherein the design entity is not required to specify the closed loop architecture test flow for controlling a specific environment of the test equipment hardware. The system is configured to perform the actions of, in response to the test controller receiving at least one response to the at least one closed command, from the arbiter passing the at least one closed command directly through the test equipment hardware to the protected IC, determining, by the test controller, based on a result of the testing of the at least one closed command in the at least one response, a next at least one closed command of the closed loop architecture test flow to send to the arbiter. The system is configured to perform the actions of sending, by the test controller, the next at least one closed command to the arbiter.

In another embodiment, a computer program product for testing a device under test comprises a computer readable storage medium having program instructions embodied therewith. The program instructions are executable by a processor to cause the processor to send, by a test controller controlled by a design entity, at least one closed command of a closed loop architecture test flow, to an arbiter of a vendor test platform controlled by a vendor entity, wherein the test controller controls testing of the closed loop architecture test flow on a protected integrated circuit (IC) integrated into an electronic assembly, as performed by test equipment hardware within the vendor test platform, wherein an input and output of the closed loop architecture test flow are nondeterministic, wherein the at least one closed command does not disclose an underlying design of the protected IC to the vendor entity. The program instructions are executable by the processor to cause the processor to control, by the design entity, the closed loop architecture test flow for testing the protected IC integrated into the electronic assembly under test, such that the design entity controls running the at least one closed command sent by the closed loop architecture test flow, on the test equipment hardware, without disclosing the underlying design of the protected IC to the vendor entity, wherein the design entity discloses an arbiter specification to the vendor entity comprising an instruction for passing the at least one closed command to a secondary communication interface of the protected IC without interpretation, wherein the design entity is not required to specify the closed loop architecture test flow for controlling a specific environment of the test equipment hardware. The program instructions are executable by the processor to cause the processor to, in response to the test controller receiving at least one response to the at least one closed command, from the arbiter passing the at least one closed command directly through the test equipment hardware to the protected IC, determine, by the test controller, based on a result of the testing of the at least one closed command in the at least one response, a next at least one closed command of the closed loop architecture test flow to send to the arbiter. The program instructions are executable by the processor to cause the processor to send, by the test controller, the next at least one closed command to the arbiter.

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

FIG. 9 illustrates one example of a high level logic flowchart of a process and program for controlling a nondeterministic testing process for calibration controlled by a design entity and performed by testing equipment controlled by a vendor entity; and FIG. 10 illustrates one example of a high level logic flowchart of a process and program for controlling a nondeterministic testing process controlled by a design entity and performed by testing equipment controlled by a vendor entity

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Figure 1:
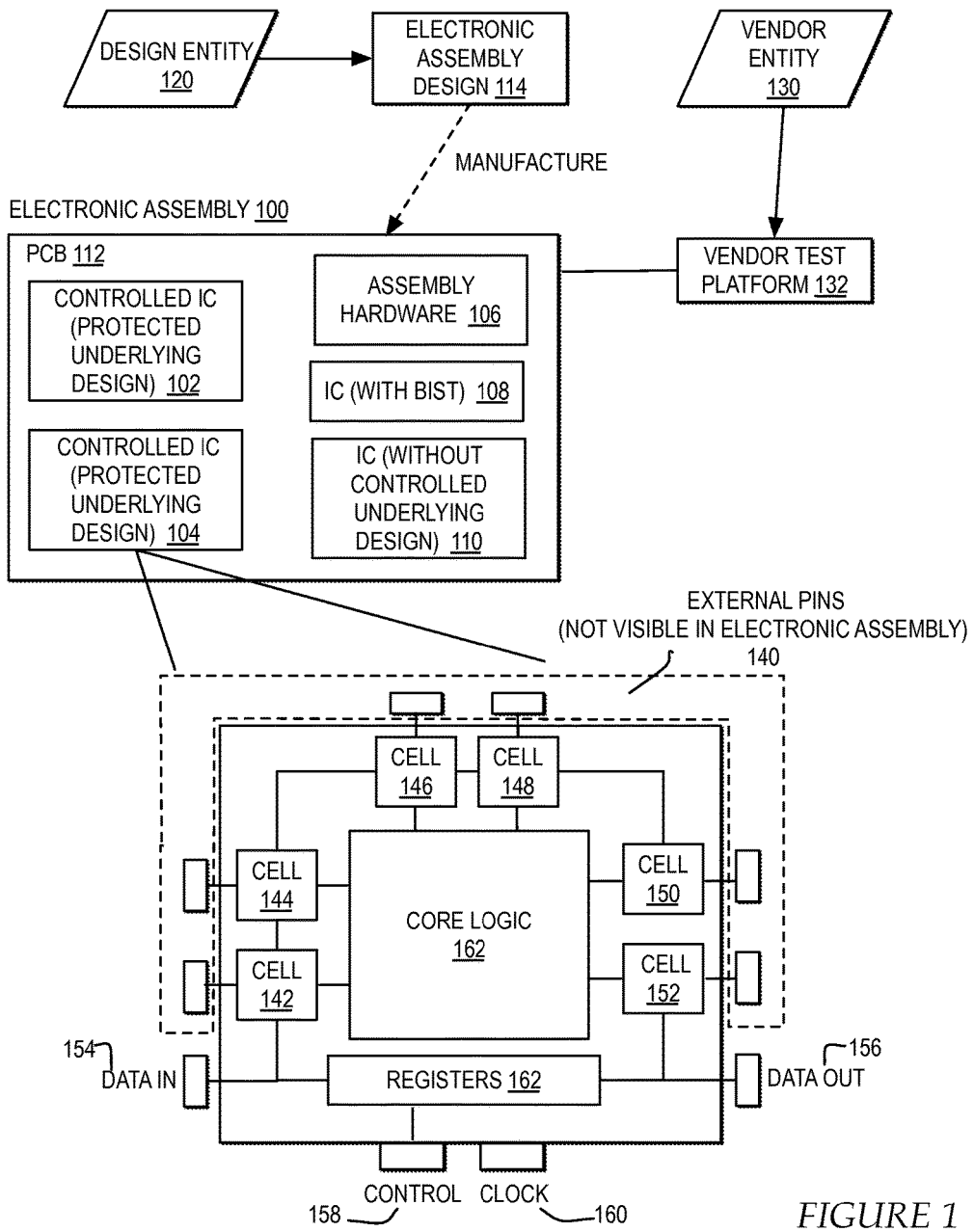
FIG. 1 illustrates one example of block diagram of an electronic assembly to be tested by a vendor entity, where the electronic assembly includes one or more controlled ICs incorporated into to the electronic assembly, where the underlying controlled IC designs are proprietary to a design entity.

FIG. 1 illustrates a block diagram of one example of an electronic assembly to be tested by a vendor entity, where the electronic assembly includes one or more controlled ICs incorporated into to the electronic assembly, where the underlying controlled IC designs are proprietary to a design entity.

In the example, an electronic assembly 100 may include one or more components that are embedded or attached to a printed circuit board (PCB) 112 or other substrate, to produce electronic assembly 100. In one example, components that are embedded or attached to PCB 112 may also be referred to as components incorporated into PCB 112. In one example, PCB 112, or other similar substrate for supporting circuit elements, may include mechanical supports and electrical connections for connecting one or more elements. In one example, PCB 112 may implement electrical connections through conductive tracks, pads, and other elements laid out and etched into metal sheets laminated onto a non-conductive substrate. One of ordinary skill in the art will appreciate that electronic assembly 100 may be manufactured using additional or alternate materials and additional or alternate electronic components.

In one example, as part of the manufacture of electronic assembly 100, one or more integrated circuits (ICs) may be incorporated into PCB 112. In one example, an IC may also be referred to as a IC chip, and may refer to one or more sets and one or more layers of electronic circuits on a semiconductor material. An IC may refer to a stand-alone, individual element, such as a stand-alone, individual processor core, that can be separately manufactured and then connected to other elements by being incorporated into a multichip board, such as PCB 112. In addition, the one or more ICs may include one or more types of ICs including, but not limited to, application-specific integrated circuits (ASICs). In one example, an ASIC is an IC that is customized for a particular use. In addition, one or more ICs may include controlled ICs with underlying core logic designs that are proprietary and that the designer wants to protect from access by third parties.

In one example, one or more ICs and other components incorporated into PCB 112 may include one or more controlled ICs, such as controlled IC 102 and controlled IC 104, where the underlying core logic design of each controlled IC is proprietary to design entity 120, one or more ICs without controlled underlying core logic design, such as IC 110, one or more ICs that include Built in Self Tests (BISTs), such as IC 108, and one or more components that provide hardware for the functions of the assembly, such as assembly hardware 106. In one example, one or more of controlled IC 102, controlled IC 104, assembly hardware 106, IC 108, and IC 110 may be initially manufactured as independent chips, which are then incorporated into PCB 112 to manufacture electronic assembly 100. When ICs are initially manufactured as independent chips, the underlying design of the core logic of each IC may be hidden within the manufactured independent chip. One of ordinary skill in the art will appreciate that electronic assembly 100 may be manufactured with additional or alternate types of incorporated components. In addition, in additional or alternate embodiments, electronic assembly may not include all the types of ICs illustrated, such as not including an IC with a BIST, such as IC 108, or not including an IC without a controlled underlying design, such as IC 110.

In one example, as illustrated, when a design entity 120 incorporates one or more independent chips, which are already manufactured, into an electronic assembly design 114, design entity 120 may not select to disclose the underlying core logic of each of the independent chips within electronic assembly design 114. In the example, design entity 120 may send electronic assembly design 114 illustrating a type of IC to position on the electronic assembly and the connections to that IC within the electronic assembly without disclosing, to the manufacturer, the underlying core logic of one or more ICs within electronic assembly design 114. In one example, design entity 120 may be the designer of one or more of controlled IC 102 and controlled IC 104 within electronic assembly design 114, which enables design entity 120 to design one or more of controlled IC 102 and controlled IC 104, as independent chips that are already manufactured, into electronic assembly design 114. In another example, design entity 120 may be authorized with knowledge of the underlying proprietary core design of one or more of controlled IC 102 and controlled IC 104, to enable design entity 120 to incorporate one or more of controlled IC 102 and controlled IC 104, as independent chips that are already manufactured, into electronic assembly design 114. In another example, design entity 120 may represent multiple designers or other owners of one or more of the underlying core logic design of controlled IC 102, the underlying core logic design of controlled IC 104 and electronic assembly design 114. Electronic assembly design 114 may also incorporate ICs where the underlying core logic design is publicly available to all parties, such as IC 110.

After electronic assembly design 114, owned by design entity 120, is manufactured into electronic assembly 100, electronic assembly 100 may need to be tested. When a manufactured electronic assembly or other device is tested, the device may be referred to as the device under test (DUT). In one example, a vendor entity 130 represents a vendor that may perform the testing of each electronic assembly 100 on a vendor test platform 132. Vendor entity 130 may also represent the entity that manufactures electronic assembly 100. In one example, design entity 120 may contract with vendor entity 130 to manufacture and test electronic assembly 100.

When ICs are manufactured into independent chips, prior to manufacture within electronic assembly 100, the external pins of each IC may be accessible for testing. In contrast, in one example, when manufactured ICs are then incorporated into a PCB during manufacture into an electronic assembly, one or more of the external pins of each IC may be embedded or attached to the substrate in a manner that hides one or more of the external pins from being visible as an input or output for use in testing. For example, as illustrated in FIG. 1, controlled IC 104 may represent a manufactured, individual chip with multiple external pins, where external pins 140 are no longer visible when controlled IC 104 is incorporated into electronic assembly 100. In one example, to enable controlled IC 104 to be tested once incorporated into electronic assembly 100, controlled IC 104 may include a secondary communication interface with one or more pins that are specified for enabling testing and are specified in electronic assembly design 114 to remain visible for testing on electronic assembly 100. In one example, the external pins specified to remain visible for testing may include one or more pins to send data in, as illustrated at reference numeral 154, and one or more pins to send data out, as illustrated at reference numeral 156, along with a pin for a clock signal, illustrated at reference numeral 160, and a pin for a control signal to indicate what to do with the data in or the data out, as illustrated at reference numeral 158. In one example, to enable testing of controlled IC 104 after controlled IC 104 is incorporated into electronic assembly 100, controlled IC 104 may also include one or more registers 162 for holding addresses and data during testing. In one example, in order to test the functionality of controlled IC 104 after controlled IC 104 is incorporated into electronic assembly 100, controlled IC 104 may also include one or more cells positioned between external pins 140 and core logic 162, where each cell represents one or more memory or register spaces each connected to one or more pins. In one example, each of cell 142, cell 144, cell 146, cell 148, cell 150, and cell 152 may each be configured as one or more shift registers for reading from and writing to external pins 140 without direct physical access to external pins 140. In one example, the secondary communication interface implemented in controlled IC 104 may represent one or more types of interfaces including, but not limited to, Joint Test Action Group (JTAG), Inter-Integrated Circuit (IIC), an industry standard two wire serial communication bus, universal asynchronous receiver/transmitter (UART), and other ASIC interfaces, that enable testing controlled of controlled IC 104 once controlled IC 104 is incorporated into electronic assembly 100. In additional or alternate embodiments, a controlled IC may include additional or alternate interfaces for enabling testing the controlled IC after the controlled IC is incorporated within electronic assembly 100.

In one example, core logic 162 of controlled IC 104 may be complex and may require testing of nondeterministic inputs and outputs, which cannot be performed by simple vector bit testing or by an internal controller built into an IC, such as the BIST in IC 108. For example, controlled IC 104 may represent an ASIC, which includes complex, application specific core logic. To perform nondeterministic testing on core logic 162, the entity controlling the test sequence may be required to have knowledge of the underlying design and functional operation of core logic 162 in order to specify a testing controller to determine and control the types of commands and order of commands to run during a test sequence, as the test sequence is being run. Moreover, even if testing of core logic 162 could be performed using simple vector bit testing, vector bit testing is performed by triggering external pins 140 and if controlled IC 104 is incorporated within electronic assembly 100, external pins 140 are no longer accessible for performing the simple vector bit testing. In addition, even if an ASIC included a BIST, a BIST controls testing inside an ASIC, but a BIST on an ASIC may not be able to internalize all of the test functions required for performing nondeterministic testing on the core logic and even if an ASIC includes a BIST, the BIST functions on an ASIC may be so complex that they must be controlled by an external test control process.

In one example, for testing of electronic assembly 100, design entity 120 may prefer not to disclose the underlying core logic design and functional operation of each of controlled IC 102 and controlled IC 104 to vendor entity 130, which may require that design entity 120 control the test run by vendor test platform 130 on electronic assembly 100. In addition, design entity 120 may prefer for vendor entity 130 to control the testing equipment of vendor test platform 132, where as part of vendor test platform 132, vendor entity 130 controls an arbiter layer for interfacing between the test controller controlled by design entity 120 and the testing equipment of vendor test platform 132. In the example, design entity 120 may prefer to control the testing process without designing, owning, or controlling the testing hardware used to perform the testing on a manufactured electronic assembly.

In contrast, if design entity 120 were to retain control of both the test run on electronic assembly 100 and vendor test platform 132, design entity 120 may need to provide vendor entity 130 with a turn key solution to control all or portions of vendor testing platform 132 for testing electronic assembly 100. In one example, design entity 120 may manufacture a turn key solution, or "black box", to vendor entity 130, to provide vendor testing platform 132. In one example, the turn key solution may provide the hardware and software for controlling nondeterministic testing on electronic assembly 100. By providing a turn key solution, design entity owns and programs the testing equipment for testing electronic assembly 100 and may not be required to disclose the protected underlying designs of controlled IC 102 and controlled IC 104 to vendor entity 130 for vendor entity 130 to test electronic assembly 100. In one example, design entity 130 may teach vendor entity 130 how to use the turn key solution, but design entity 130 may retain control of all proprietary design information within controlled IC 102 and controlled IC 104. While by providing a turn key solution design entity 120 retains complete control of the underlying designs of controlled IC 102 and controlled IC 104, design entity 120 also incurs the expense of designing and manufacturing test equipment for use by vendor entity 130. If design entity 120 contracts with multiple manufacturers to manufacture and test electronic assembly 100 and provides a turn key solution for controlling vendor testing platform 132, design entity 120 incurs an additional expense per manufacturer for the turn key solution.

In addition, in contrast, if design entity 120 were to give control of both the test run on electronic assembly 100 and vendor test platform 132 to vendor entity 130, design entity 130 may be required to provide vendor entity 130 with the information for the underlying design and functionality of controlled IC 102 and controlled IC 104, to enable vendor entity 130 to write a test program, for running on vendor test platform 132, to control nondeterministic testing on electronic assembly. In the example, by design entity 120 not controlling vendor test platform 132, design entity 120 may not directly incur the costs associated with owning or programming vendor test platform 132. However, in the example, design entity 120 loses direct control over the underlying design and functionality of controlled IC 102 and controlled IC 104. Even though design entity 120 may require that vendor entity 130 enter into an agreement that directs the authorized uses of the protected underlying designs of controlled IC 102 and controlled IC 104, design entity 120 is still releasing the protected underlying designs to another entity and would only have indirect control over the protection of the proprietary design information. In addition, in the example, design entity 120 may need to contract with a vendor entity that has employees with sufficient skill to understand the customized portions of the underlying design of controlled IC 102 and controlled IC 104 and to design the test program for the unique portions, which may increase the cost of manufacture. If design entity 120 contracts with multiple manufacturers to manufacture and test electronic assembly 100 and provides each manufacturer with information for the underlying design and functionality of controlled IC 102 and controlled IC 104, design entity 120 loses direct control over the underlying design and functionality of controlled IC 102 and controlled IC 104 across multiple distribution paths.

Figure 2:
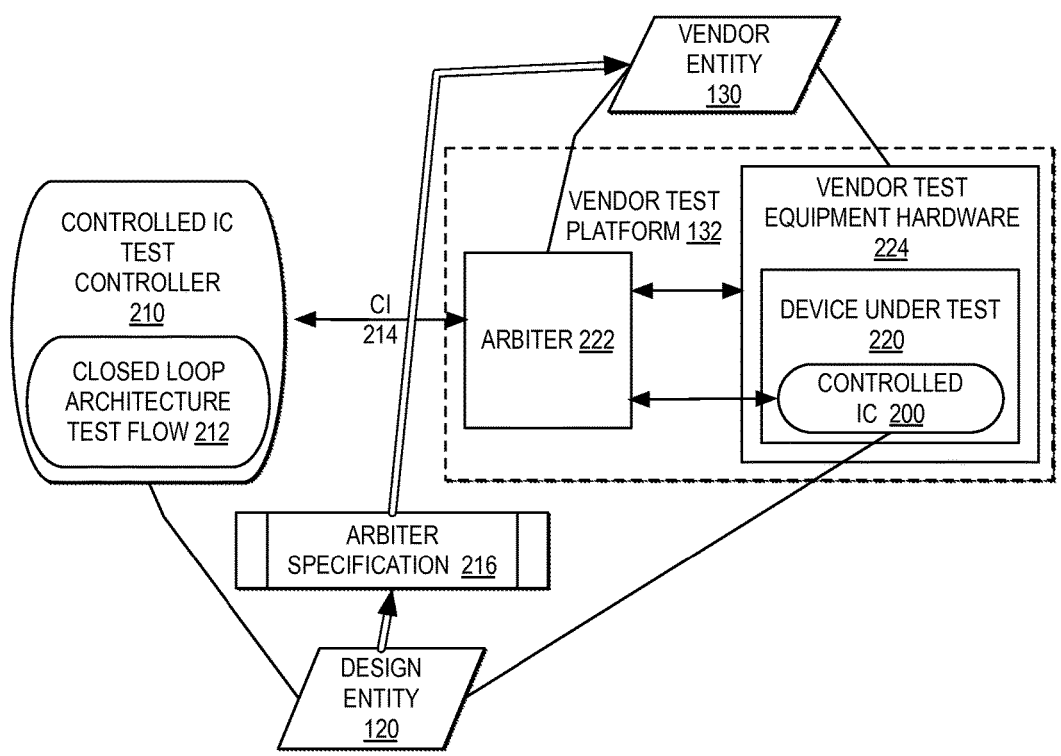
FIG. 2 illustrates one example of a block diagram of a device under test by a vendor entity, where the vendor entity controls a vendor test platform, including an arbiter and vendor test equipment hardware, and where a design entity controls a closed loop architecture test flow for controlling a test run on an electronic assembly including one or more controlled IC incorporated into the electronic assembly.

FIG. 2 illustrates a block diagram of one example of a device under test by a vendor entity, where the vendor entity controls a vendor test platform, including an arbiter and vendor test equipment hardware, and where a design entity controls a closed loop architecture test flow for controlling a test run on an electronic assembly including one or more controlled IC incorporated into the electronic assembly.

In one embodiment, a device under test 220 represents an electronic assembly, such as electronic assembly 100, which includes one or more ICs incorporated into a PCB or other substrate for supporting electrical connections. In one example, one or more controlled ICs, such as controlled IC 200, which may represent controlled IC 102 or controlled IC 104, are incorporated into device under test 220, where design entity 120 controls the underlying proprietary design of controlled IC 200.

In one example, vendor entity 130 may be responsible for managing the testing of device under test 220 on vendor test platform 132. In the example illustrated in FIG. 2, design entity 120 and vendor entity 130 may work in tandem to perform the testing of device under test 220 with each entity retaining control of a portion of the full testing process. In one example, to enable design entity 120 and vendor entity 130 to work in tandem to perform the testing of device under test 220, a controlled IC test controller 210 may be controlled by design entity 120 and vendor test platform 132 may be controlled by vendor entity 130. In one example, "control" may refer to one or more of the following, but is not limited to, ownership of hardware, software, or data, direct control over the manufacture or use of hardware, software, or data, or direct management of the functionality of a hardware, software, or data element.

In the example illustrated in FIG. 2, vendor entity 130 may not need knowledge of the underlying design or functional details of controlled IC 200 to perform the testing on device under test 220 and design entity 120 does not need knowledge of the particular type of hardware environment implemented by vendor test platform 132 to control a testing process on vendor test platform 132.

In one example, controlled IC test controller 210 executes a closed loop architecture flow 212 that issues commands for execution on controlled IC 200 for performing deterministic and nondeterministic testing of controlled IC 200. Controlled IC test controller 210 is a closed loop control system, processing both inputs and outputs. In one example, nondeterministic testing may including a test in which the output of a future test sequence may not be known in advance, without evaluation of return data from a current test sequence step. Closed loop feedback through closed loop architecture flow 212 may be required for nondeterministic testing in order to evaluate the return data from a current test sequence step and determine which test sequence to advance.

In one example, vendor test platform 132 implements an arbiter 222 for providing a bridge translation layer for managing distribution of the commands issued by controlled IC test controller 210 to vendor test equipment hardware 224. Vendor test equipment hardware 224 represents the hardware environment selected and implemented by vendor entity 130. In the example, design owner 120 can retain control of the test process performed on device under test 220, through closed loop architecture flow 212, without disclosing the underlying design of controlled IC 200, without owning vendor test platform 312, and without needing knowledge of the hardware environment of vendor test equipment hardware 224. In one example, closed loop architecture flow 212 may be performed in a closed source application, such as a closed source C/C++ application.

In one example, controlled IC test controller 210 may connect with arbiter 222 via a communication interface (CI) 214, which may include one or more types of standard communication interfaces including, but not limited to, universal serial bus (USB), Ethernet, Transmission Control Protocol/Internet Protocol (TCP/IP) socket, or Interprocess Communication (IPC) pipe. In one example, controlled IC test controller 210 operates in an external computer system independent of vendor test platform 132. For example, controlled IC test controller 210 may run on a generic computer system that is platform independent, allowing controlled IC test controller 210 to be reused for multiple products or generations of products. In another example, controlled IC test controller 210 and arbiter 222 may independently execute on a same hardware system and connect via CI 214 within the hardware system via a software IPC bridge, for example.

In one example, controlled IC test controller 210 may issue multiple types of commands for testing device under test 220. For example, controlled IC test controller 210 may issue generic test actions that disclose a functional operation to be performed, in the command, which may be referred to as "open" commands, and controlled IC test controller 210 may issue proprietary, controlled IC specific commands, which may be referred to as "closed" commands, and do not disclose the functional operation to be performed, in the command. In additional or alternate embodiments, controlled IC test controller 210 may issue additional or alternate types of commands.

In one example, design entity 120 may provide arbiter specifications 216 to vendor entity 130 identifying each type of command, such as for identifying each of the of "open" commands and "closed" commands. Vendor entity 130 may specify arbiter 222 according to arbiter specifications 216 to provide a bridge layer for interfacing with controlled IC test controller 210 through CI 214, for receiving the different types of commands from controlled IC test controller 210, for controlling distribution of the different types of commands to vendor test equipment hardware 224. In one example, vendor entity 130 may select the software and hardware platform implemented in vendor test platform 132 and specify the software and hardware platform according to arbiter specifications 216 to connect to controlled IC test controller 210 and to interpret simple commands from controlled IC test controller 210.

In one example, arbiter specification 216 may provide, for an "open" type command, a full test specification of the action that needs to be taken for the command. In one example, vendor entity 130 may specify functions of arbiter 222 according to arbiter specifications 216 such that when arbiter 222 detects "open" type commands, the commands should be interpreted by arbiter 222 and the type of functional operation specified in the "open" command translated into one or more control signals specified by vendor entity 130 for controlling vendor test equipment hardware 224 to perform the specified functional operation. Arbiter 222, programmed and controlled by vendor entity 130, enables design entity 120 to control generic test actions on electronic assembly device under test 220 without needing knowledge of the type of environment of vendor test equipment hardware 224. In one example, "open" type commands may communicate generic test operations including, but not limited to, "Power On" and "Reset" and may include generic information including, but not limited to, "test status" and "debug information". In one example, arbiter 222 responds to a "power on" open command by sending a signal to vendor test equipment hardware 224 to enable power. In one example, arbiter 222 responses to a "reset" open command by sending a signal to vendor test equipment hardware 224 to toggle an external reset line.

In one example, arbiter specification 216 may provide, for a "closed" type command, a limited specification that only defines how to pass the command to and from the target controlled IC 200. No information is disclosed in arbiter specification 216 about what functional operation the command data and address will perform on the target controlled IC 200. In one example, vendor entity 130 may specify functions of arbiter 222 according to arbiter specifications 216 such that when arbiter 222 detects "closed" type commands, the commands should be passed directly to controlled IC 200 without interpretation. Arbiter 222, which is programmed and controlled by vendor entity 130, enables design entity 120 to control proprietary, controlled IC commands performed on controlled IC 200 during testing without design entity 120 being required to own or design vendor test equipment hardware 224 and without design entity 120 being required to disclose the underlying design of controlled IC 200 to vendor entity 130. In one example, a "closed" command may include command to write data to an address, where arbiter 222 forwards the data and writes the data to controlled IC 200 through a secondary communication interface of controlled IC 200. In one example, an "open" command may include a command to read data from an address, where arbiter 222 reads the data through the secondary communication interface of controlled IC 200.

In one example, by design entity 120 controlling closed loop architecture test flow 212 through controlled IC test controller 210, the closed type commands issued by design entity 120 may control nondeterministic testing of device under test 220 without design entity 120 revealing any information about which functions are being tested by the closed type commands and without revealing any information about the algorithm performed by closed loop architecture test flow 212 to perform testing of device under test 220. In addition, in one example, by design entity 120 controlling closed loop architecture test flow 212 through controlled IC test controller 210, the closed type commands issued by design entity 120 may control nondeterministic testing of device under test 220 without requiring design entity 120 to add any additional testing elements to controlled IC 200 and without requiring design entity 120 to implement a complex BIST or other embedded processor and memory for controlling testing within controlled IC 200, both of which would require valuable space on the PCB of controlled IC 200.

In the example illustrated in FIG. 2, by design entity 120 only needing to provide vendor entity 130 with arbiter specifications 216 for vendor entity 130 to specify functions of arbiter 222, arbiter specifications 216 do not need to disclose any proprietary information about the underlying functional design of controlled IC 200. In addition, by design entity 120 only needing to provide arbiter specifications 216 to vendor entity 130 for vendor entity 130 to specify arbiter 222 to enable arbiter 222 to control distribution of different types of commands from controlled IC test controller 210, code porting by both design entity 120 and vendor entity 130 for performing testing on electronic assembly device under test 220, is minimized. In addition, by design entity 120 only needing to provide arbiter specifications 216 to vendor entity 130 for vendor entity 130 to specify arbiter 222 to enable arbiter 222 to control distribution of different types of commands from controlled IC test controller 210, design entity 120 may provide arbiter specifications 216 to multiple vendors building electronic assembly device under test 220 and connect the same controlled IC test controller 210 to arbiters of multiple vendors, for uniform testing of electronic assembly device under test 220 across multiple vendors.

In one example, in the example illustrated in FIG. 2, design entity 120 may specify controlled IC test controller 210 to generically control vendor test equipment hardware, independent of any particular vendor test equipment hardware specifications. For example, design entity 120 may know that controlled IC test controller 210 will need to enable standby voltage through a DUT connector I/O, but design entity 120 may not know how any particular vendor has designed the power system for the vendor's test equipment hardware. In the example, design entity 120 specifies controlled IC test controller 210 to send a command with a generic "open" request to enable the voltage. In the example, arbiter 222 receives the generic "open" request to enable the voltage and determines which signals to trigger to perform the request on the specific vendor test equipment hardware. In contrast, in the example illustrated in FIG. 2, vendor entity 130 does not know how to generate test commands for testing controlled IC 200, but based on the command specifications in arbiter specification 216, vendor entity 130 may specify arbiter 222 such that arbiter 222 receives an ASIC read or write command, arbiter 222 forwards the ASIC read or write command to controlled IC 200 without interpreting the command.

Figure 3:
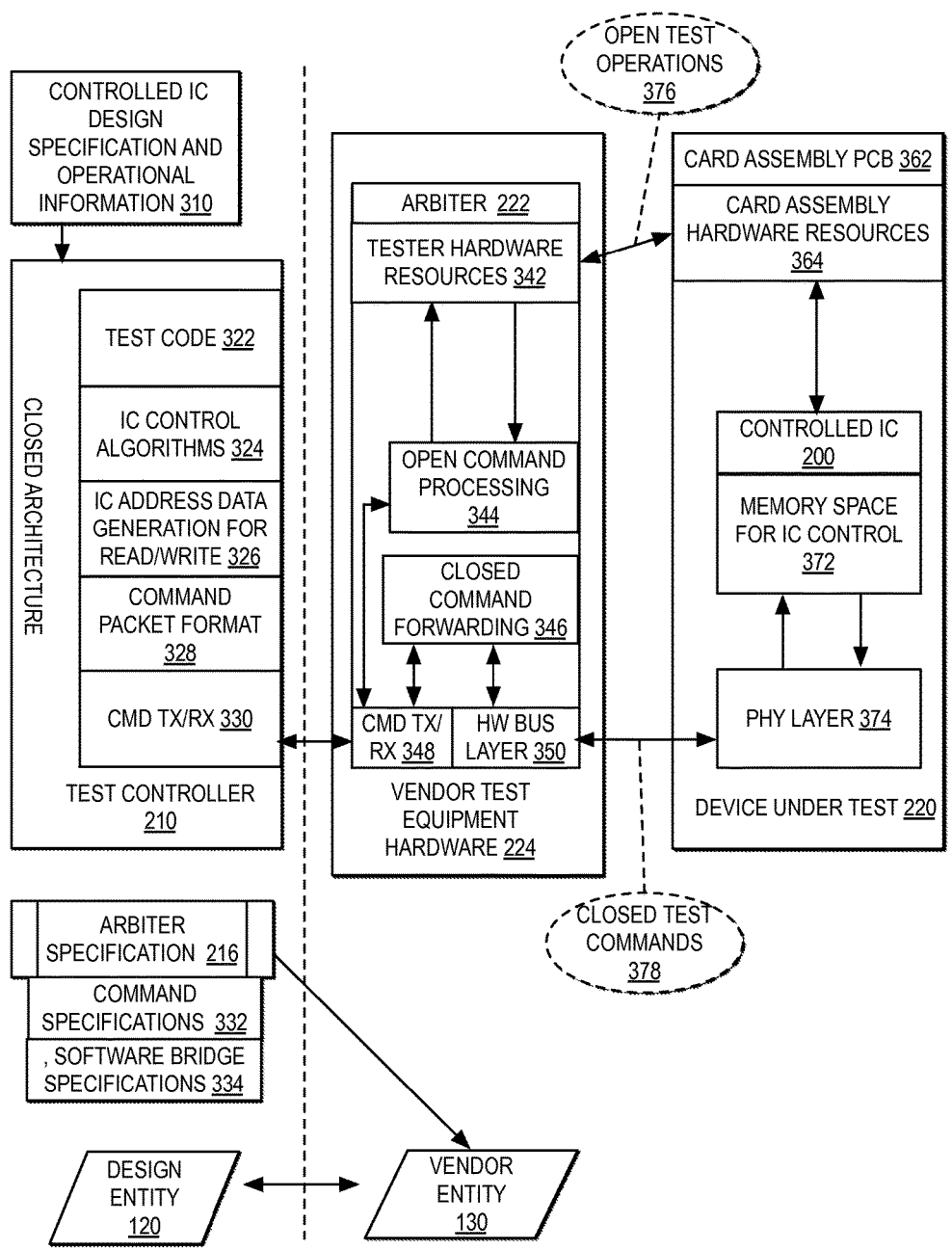
FIG. 3 illustrates one example of a block diagram of a device under test by a vendor entity, where the vendor entity controls a vendor test platform including an arbiter and vendor test equipment hardware, and where the controlled IC designer controls a closed loop architecture test flow, where the arbiter distributes open commands to card assembly hardware resources and distributes closed commands to a memory space for IC control of a controlled IC integrated within the device under test.

FIG. 3 illustrates a block diagram of one example of a device under test by a vendor entity, where the vendor entity controls a vendor test platform including an arbiter and vendor test equipment hardware, and where the controlled IC designer controls a closed loop architecture test flow, where the arbiter distributes open commands to card assembly hardware resources and distributes closed commands to a memory space for IC control of a controlled IC integrated within the device under test.

In one example, test controller 210 implements a closed architecture for controlling a test process, such as for controlling closed loop architecture test flow 212. In one example, test controller receives controlled IC design specifications and operational information 310. Controlled IC design specifications and operational information 310 may include the underlying design specification for controlled IC 200, including, but not limited to, core logic specifications, functions, memory space specifications, and other electrical specifications. In the example, controlled IC 200 is attached or embedded in design under test 220. One or more of the functional components of test controller 210 are specified according to controlled IC design specification and operational information 310 for controlling a test process on controlled IC 200 as attached within device under test 220.

In one example, test controller 210 may determine and control test sequences, processes and algorithms for verifying proper operation of electrical components or circuits on an electronic assembly under test. Test controller 210 may include one or more functional components including, but not limited to, test code 322 for determining and controlling selection of test sequences required to validate the electrical operation of a device under test, IC control algorithms 324 for controlling test sequences on an IC and test equipment, IC address data generation for read/write 326 for generating outputs including addresses and data for read/write requests and formatting the outputs, command packet format 328, for formatting each command packet for transmission and processing inputs, and command (CMD) transmit/receive (TX/RX) 330, for controlling transmission and receipt of packets via a communication interface with CMD TX/RX 348 of vendor test equipment hardware 224 and may provide a component for determining pass and fail conditions. In one example, IC control algorithms 324 provide a controller for performing closed loop control of testing for applications where the input and output is nondeterministic. For example, to support nondeterministic testing, IC control algorithms 324 may include steps for analyzing data collected during a test sequence and determining a next test sequence to perform based on the results of the previous test sequence. IC control algorithms 324 may also support testing where the inputs and outputs are deterministic, using simpler vector files that include a preset selection of commands to perform, boundary scanning, or other deterministic testing. In one example, IC data generation for read/write 326 may also include an encryption controller for encrypting any address and data in a command using an encryption key known to controlled IC 200. In additional or alternate embodiments, test controller 210 may include additional or alternate functional components.

In the example, while controlled IC design specification and operational information 310 may not be disclosed to vendor entity 130, design entity 120 may disclose arbiter specification 216 to vendor entity 130. In one example, arbiter specification 216 may include command specifications 332, which specify different types of commands, including, but not limited to, "open" commands and "closed" commands, and may include software bridge specifications 334, which specify requirements of arbiter 222 for connecting with test controller 210 and general instructions for handling each type of test equipment action command that are generic and independent of any particular vendor test equipment hardware specification. Vendor entity 130 may specify one or more functions of arbiter 222 according to arbiter specification 216 and according to the specification of vendor test equipment hardware 224 to enable CMD TX/RX 348 of arbiter 222 to communicatively connect with CMD TX/RX 330 of test controller 210 and to enable arbiter 222 to control how the different types of commands received from test controller 210 are handled to specifically function on vendor test equipment hardware.

In one example, CMD TX/RX 348 is specified according to arbiter specification 216 to receive commands from test controller 210, determine whether the command is an "open" command or "closed" command, pass each "open" command to open command processing 344, and pass each "closed" command to closed command forwarding 346.

In one example, closed command forwarding 346 automatically converts an IC register read command passed by test controller 210 to an IC register read command of a hardware abstraction layer (HAL) in a hardware bus protocol, where the HAL allows instructions from closed command forwarding 346 to communicate with lower level components of a physical layer 374. In addition, in one example, closed command forwarding 346 automatically converts an IC register write command passed by test controller 210 to an IC register write command of the HAL in a hardware bus protocol. In one example, the HAL may operate at lower level in a computer language and may interact directly with hardware.

Closed command forwarding 346 sends the converted closed test command in the hardware bus protocol out on a hardware (HW) bus layer 350. HW bus layer 350 passes converted closed test commands between HW bus layer 350 and a physical (PHY) layer 374 of electronic assembly design under test 220. PHY layer 374 passes the closed commands to a memory space for IC control 372 for controlling operations on controlled IC 200 based on address data specified in the closed commands that directs operations on controlled IC 200 to test operation of controlled IC 200. In one example, physical layer 374 may represent one or more of the pins or other interfaces illustrated in FIG. 1 by data in 154, data out 156, control 158, and clock 160. In one example, memory space for IC control 372 may present one or more of the register and cell spaces illustrated in FIG. 1 by cell 142, cell 144, cell 146, cell 148, cell 150, cell 152, and registers 162. In one example, a closed command may include a command to read from a particular address or write data to a particular address, where the functionality of controlled IC 200 being tested by the closed command is not disclosed in the closed command. In one example, the secondary communication interface provided by physical layer 374 and memory space for IC control 372 implemented using a JTAG architecture. Within the JTAG architecture, a closed read command may include a JTAG read command and closed command forwarding 346 may forward the JTAG read command as a JTAG read action for directing control of control 158. In addition, with the JTAG architecture, a closed write command may include a JTAG write command and closed command forwarding 346 may forward the JTAG write command as a JTAG write action for directing control of control 158.

In one example, open command processing 344 processes open commands by extracting the operational test equipment action function from the open command and determining which of tester hardware resources 342 to signal to perform generic test operations on electronic assembly design under test 220. In one example, electronic assembly design under test 220 includes a base layer of card assembly PCB 362 and card assembly PCB 362 includes card assembly hardware resources 364 for controlling hardware functions of card assembly PCB 362. The one or more resources selected from tester hardware resources 342 open test operations 376 to card assembly resources 364 to perform generic test equipment actions within card assembly PCB 362. In one example, an open command may include a test equipment action including, but not limited to, a command to set the operational voltage of device under test 220 to a particular voltage, and a command to set a power on reset (POR). In one example, card assembly hardware resources 364 may include one or more interfaces for setting the voltage within one or more components of device under test 220 to the voltage specified in the command. In one example, open command processing 344 of arbiter 222 may implement a specific test equipment action sent by test controller 210 and return a status of the completion of the test equipment action to test controller 210.

In one example, if test controller 210 detects a failure while running a test sequence, test controller 210 may report the failure to arbiter 222 or another vendor entity interface, and test controller 210 may report information about which component of device under test 220 failed. In an additional or alternate embodiment, one or more of test controller 210 and vendor test equipment hardware 224 may include additional or alternate controllers that perform additional processing of failure information in response to test controller 210 detecting a failure.

Figure 4:
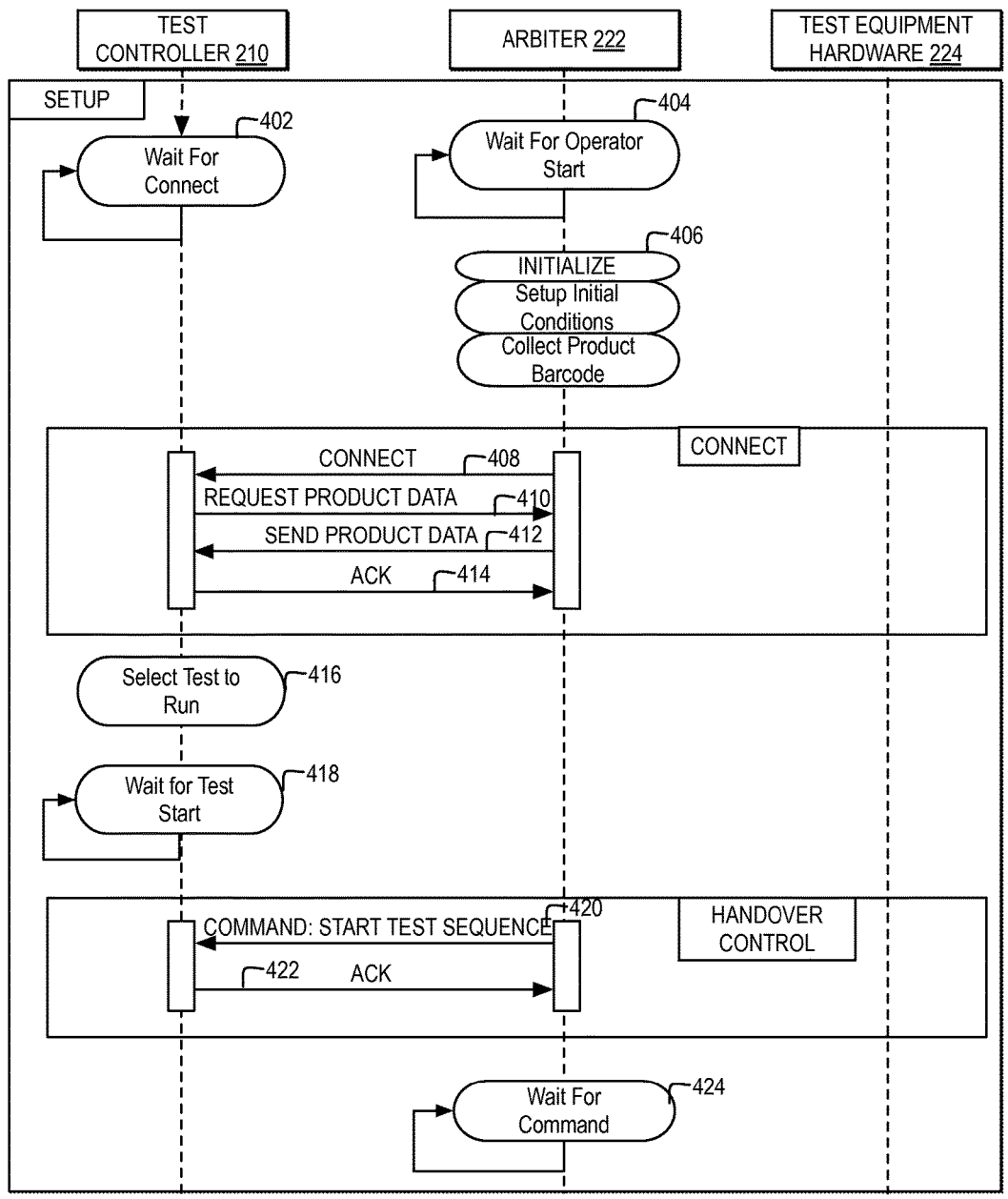
FIG. 4 illustrates one example of a high level logic flow diagram of a process and program performed by a test controller owned by a design entity and by an arbiter owned by a vendor entity to setup a communication link between the test controller and the arbiter for the test controller to control the setup of a test process on test equipment hardware owned by the vendor entity.

FIG. 4 illustrates a flow diagram of a process and program performed by a test controller owned by a design entity and by an arbiter owned by a vendor entity to setup a communication link between the test controller and the arbiter for the test controller to control the setup of a test process on test equipment hardware owned by the vendor entity.

In one example, FIG. 4 illustrates a process and program for running each of test controller 210, arbiter 222, and test equipment hardware 224. In one example, a process and program for setup of test controller 210 starts at block 402. At block 402, the process waits for a connect from arbiter 222. In one example, a process and program for setup of arbiter 222 waits for an operator start at block 404. In the example, when an operator starts a test run for testing an electronic assembly device under test, the process passes to block 406. Block 406 illustrates initializing arbiter 222 including setup of initial conditions for testing the device under test and collecting a product barcode of the electronic assembly device under test. Next, the process of test controller 210 and arbiter 222 moves into a connect phase.

As illustrated at reference numeral 408, in a connect phase, the process running on arbiter 222 passes a connect signal to test controller 210. As illustrated at reference numeral 410, in response to receiving the connect signal, test controller 210 stops waiting at block 402 and responds to arbiter 222 with a request product data signal, requesting the product data for the device under test. As illustrated at reference numeral 412, in response to arbiter 222 receiving the request product data signal, arbiter 222 responds to test controller 210 with a send product data signal, including product data for the electronic assembly device under test. As illustrated at reference numeral 414, in response to test controller 210 receiving the sent product data signal, test controller 210 responds to arbiter 222 with an acknowledgement (ACK) that the product data was received.

Next, the process running on test controller 210 passes to block 416. Block 416 illustrates selecting a test to run from among multiple tests available for test controller 210 to run. Next, block 482 illustrates the process on test controller 210 waiting for a test start signal. Next, the process of test controller 210 and arbiter 222 moves into a handover control phase.

As illustrated at reference numeral 420, in a handover control phase, the process running on arbiter 222 passes a command to test controller 210 to start the test sequence and passes to block 424. At block 424, arbiter 222 waits for a test sequence command from test controller 210. As illustrated at reference numeral 422, in response to test controller 210 receiving the command to start the test sequence, test controller 210 responds with an ACK that the start test sequence command was received.

Figure 5:
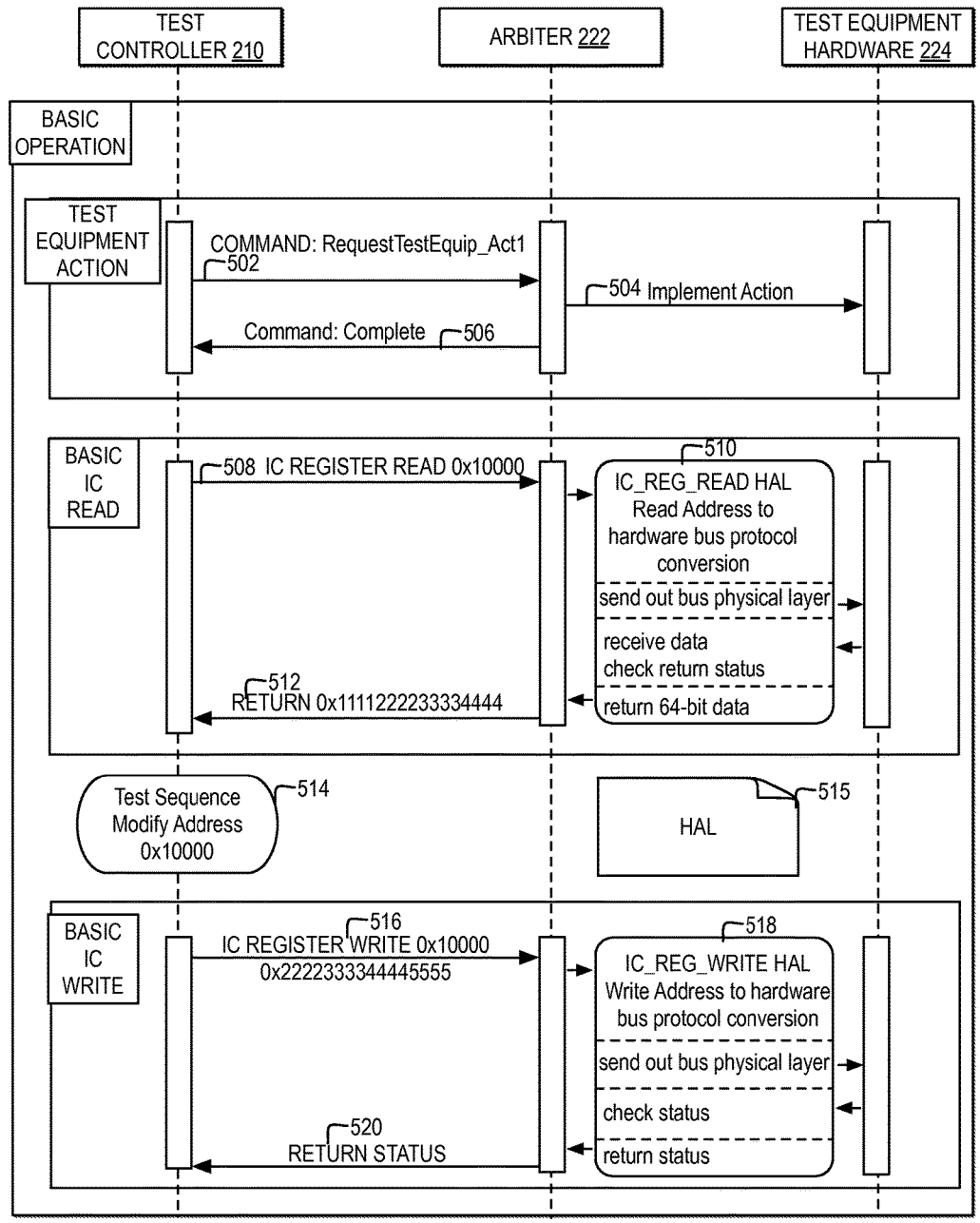
FIG. 5 illustrates one example of a high level logic flow diagram of a process and program performed by a test controller owned by a design entity and by an arbiter owned by a vendor entity to handle commands of a test sequence controlled by the test controller and sent to the arbiter, for the test controller to control a test process on test equipment hardware owned by the vendor entity.

FIG. 5 illustrates a flow diagram of a process and program performed by a test controller owned by a design entity and by an arbiter owned by a vendor entity to handle commands of a test sequence controlled by the test controller and sent to the arbiter, for the test controller to control a test process on test equipment hardware owned by the vendor entity.

In one example, FIG. 5 illustrates a process and program for running each of test controller 210, arbiter 222, and test equipment hardware 224 to perform basic operations following completion of the setup process and program illustrated in FIG. 4.

In one example, a phase is illustrated for performing open commands in which the command issued by test controller 210 during a test sequence specifies the type of test equipment function for an action that needs to be executed by the test equipment hardware as part of the test sequence. In one example, a test equipment action may refer to a function of the device under test that is disclosed to vendor entity 130 and not part of the proprietary underlying design of one or more controlled ICs integrated into the device under test. In one example, a test equipment action may fall into an "open command" category. In additional or alternate examples, additional or alternate a test sequence may include additional or alternate types of test equipment actions that direct one or more types of actions on test equipment including, but not limited to, power on reset (POR). In one example, the vendor entity that owns or supplies test equipment hardware 224 may determine how to implement test equipment actions within test equipment hardware 224. In one example, test controller 210 does not need to know how arbiter 222 or test equipment hardware 224 implements the test equipment actions because test controller 210 only needs to request a particular test equipment action that needs to be executed by test equipment and arbiter 222 controls implementing the specific test equipment action on test equipment hardware 224.

In one example, if a test equipment action request is to be issued by test controller 210, for a particular test equipment action referred to as "Act1", as illustrated at reference numeral 502, test controller 210 sends a command with a functional operation for the requested test equipment action specified in the command. For example, as illustrated at reference numeral 502, the command may specify a functional operation "RequestTestEquip_Act1". As illustrated at reference numeral 504, in response to arbiter 222 receiving a command with a specific functional operation to be performed by test equipment hardware 224, arbiter 222 translates the functional operation into a control signal for implementing the test equipment action specified for test equipment hardware 224 and sends a control signal to test equipment hardware 224 to implement the action. For example, as illustrated at reference numeral 504, if "Act1" specifies a functional test equipment action of "3.3 V ON", arbiter 222 sends a control signal of "3.3 V regulator enable low" to test equipment hardware 224 to direct test equipment hardware 224 to control the amount of voltage applied to the device under test. As illustrated at reference numeral 506, arbiter 222 sends a response to test controller 210 indicating the command is completed. A generic command to control an amount of voltage applied to an device under test does not disclose any proprietary information about the underlying design of any controlled ICs on the electronic assembly device under test.

In one example, additional phases of a test sequence include test controller 210 controlling IC specific commands. In the example illustrated, IC specific commands issued by test controller 210 may only specify a read or a write command with an address for arbiter 222 to pass through to the controlled IC on the electronic assembly device under test. In one example, IC specific commands merely recite a read or write command, without disclosing the function to be tested by the command and without disclosing information about the underlying design of the controlled IC.

In the example illustrated, the controlled IC implements a secondary communication interface including PHY layer 374 and memory space for IC control 372, which allows for setting and retrieving the values of pins of a controlled IC that are not visible when the controlled IC is integrated into an electronic assembly, to enable testing from the values at pins that are not visible. In one example, the PHY layer and memory space is a JTAG interface implemented to enable testing of controlled IC, where the JTAG interface adds cells between the external connection pins and the internal logic of a device, with the cells configured as shift registers, to enable reading from and writing to the pins of a device, and the core logic connected to them, without direct physical access to the pins. In one example, for controlling register read and write operations in a controlled IC, the JTAG interface is used. In one example, a JTAG command for triggering a JTAG action to read from JTAG interface is labeled as "IC_REGISTER_READ" and a JTAG command for triggering a JTAG action to write to the JTAG interface is labeled as "IC_REGISTER_WRITE".

In the example, as illustrated at reference numeral 508, when running a test sequence, test controller 210 may send a command specifying a read command and an address to read from, such as an address of 0x10000. As illustrated at reference numeral 510, arbiter 222 receives the read command of "IC_REGISTER_READ" and automatically converts the read command into an IC_REG_READ HAL command with the read address in a hardware bus protocol, through HAL 515, and sends the converted read command through the bus physical layer of the controlled IC through test equipment hardware 224, without receiving any information about the functional operation to be tested by the converted read command. As illustrated at reference numeral 510, arbiter 222 receives data from test equipment hardware 224 and checks the status of the converted read command. As illustrated at reference numeral 510, in response to the status check passing, test equipment hardware 224 returns the result of the converted read command, which is the 64-bit data read from the specified address. As illustrated at reference numeral 512, in response to arbiter 222 receiving the 64-bit data from test equipment hardware 224, arbiter 222 returns the 64-bit data, such as "0x1111222233334444" to test controller 610.

While arbiter 222 is not aware of the functional operation being tested by the converted read command, in response to test controller 210 receiving the returned 64-bit data, test controller 210 is aware of the functional operation being tested by the converted read command and test controller 210 determines a next step of the test sequence to control. In one example, where test controller 210 runs a nondeterministic test sequence, the results of each command of the test sequence may determine the next command of the test sequence. For example, the result returned of 0x1111222233334444 may determine that the next step in a test sequence is a command to modify the data at the address that was read from. In one example, a nondeterministic test may include a test in which the output of a future test sequence cannot be known in advance without evaluation of return data from the current test sequence. For test controller 210 to run a nondeterministic test, a closed loop feedback with arbiter 222 is required for test controller 210 to advance to a next test sequence in response to evaluation of return data from arbiter 222 for the current test sequence.

In the example, as illustrated at block 514, when running a test sequence, the test sequence may include a step for modifying an address, such as an address of 0x10000, which was previously read from, through a write command. In one example, to control the test sequence command of "IC REGISTER WRITE 0x10000", test controller 210 may send a command specifying a write command, an address to write to, such as an address of 0x10000, and a value to write to the address, such as 0x2222333344445555. As illustrated at reference numeral 518, arbiter 222 receives the write command of "IC_REGISTER_WRITE" and automatically converts the write command into an IC_REG_WRITE HAL command with the write address and write data in a hardware bus protocol, through HAL 515, and sends the converted write command through the bus physical layer of the controlled IC through test equipment hardware 224, without receiving any information about the functional operation to be tested by the converted write command. As illustrated at reference numeral 518, arbiter 222 checks the status of the converted write command. As illustrated at reference numeral 518, in response to the status check passing, test equipment hardware 224 returns the status. As illustrated at reference numeral 520, in response to arbiter 222 receiving the return status from test equipment hardware 224, test controller 210 determines that the write command was performed. In response to test controller 210 determining the write command was performed, test controller may determine and control a next step in a test sequence from among a test equipment action command, a read command and a write command.

Figure 6:
FIG. 6 illustrates one example of a process for controlling one or more of the phases of a design entity controlling a test run by a vendor entity on a design under test, on test equipment hardware controlled by a vendor entity.

FIG. 6 illustrates one example of a process for controlling one or more of the phases of a design entity controlling a test run by a vendor entity on a design under test, on test equipment hardware controlled by the vendor, as illustrated in FIG. 4 and FIG. 5.

In one example, code 600 represents one example of a code process, which may be run in part by each of a test controller 210 and an arbiter 222, for controlling one or more of the phases of a design entity controlling a test run by a vendor entity on a design under test, on test equipment hardware controlled by the vendor.

In one example, in a setup phase, as illustrated at reference numeral 602, a command "TestEquipment->WaitForOperatorStart( )" directs the process at arbiter 222 to wait for the equipment operator to load and start the test, which is also illustrated at block 404 of FIG. 4. Next, as illustrated at reference numeral 604, a command "TestEquipment->SetupInitialConditions( )" directs the process at arbiter 222 to set up any preconditions for the test equipment, and, as illustrated at reference numeral 606, a command "ProdData=TestEquipment->GetProductBarcodeData( )" directs collection by arbiter 222 of product barcodes, lot codes, and other tracking information, which is also illustrated at block 406. Next, as illustrated at reference numeral 608, a command "TestController->connect( )" directs arbiter 222 to establish a connection to test controller 210, which is also illustrated at reference numeral 408. Next, as illustrated at reference numeral 610, a command "TestController->SendProductData(ProdData)" directs arbiter 222 to send product data to test controller 210 so test controller 210 can determine which test to run, which is also illustrated at reference numeral 412. Next, as illustrated at reference numeral 612, a command "TestController->StartTestSequence( )" directs arbiter 222 to request that test controller 210 start the test, which is also illustrated at reference numeral 420. Starting the test also includes transfer of control from arbiter 222 to test controller 210 and arbiter 222 waiting for commands from test controller 210, which is also illustrated at block 424. One or more types of communication handshaking to establish a channel between arbiter 222 and test controller 210 may also be implemented.

In one example in an operation phase, as illustrated at reference numeral 614, a command "TestController->WaitForCommand( )" directs the arbiter to wait for the test sequence algorithm for the test controller to determine the next command. As illustrated at reference numeral 616, a command "Command=TestController→ReceivedCommand", sets the command to be executed for the cycle to the command received from the test sequence algorithm for the test controller. Next, as illustrated at reference numeral 618, if the command is an "ASIC_READ" command, for a read command for a controlled IC, the command is processed by arbiter 222 setting "data=JTAG->ScanGetData(ASIC_READ.address)" and "TestController→SendASICReadData(data)", which is also illustrated at reference numeral 508. As illustrated at reference numeral 620, if the command is an "ASIC_WRITE" command, for a write command for a controlled IC, the command is processed by arbiter 222 setting "data=JTAG->ScanPutData(ASIC_WRITE.address.ASIC_WRITE.data" and "TestController->SendStatus( )", which is also illustrated at reference numeral 516. In another example, as illustrated at reference numeral 622, for a "TEST_EQUIPMENT_ACTION", which may represent an open command or generic, test equipment action, the command is processed by setting "status=TestEquipment→TestEquipmentAction( )" and "TestController->SendStatus(status)", which is also illustrated at reference numeral 502. In one example, an example of a "TEST_EQUIPMENT_ACTION" may include a DUT_POR command for directing a power on reset (POR) of the design under test (DUT). In one example, as illustrated at reference numeral 624, if the command is a "ENDTEST" command, the command is processed by the test controller handing control back to the arbiter.

Figure 7:
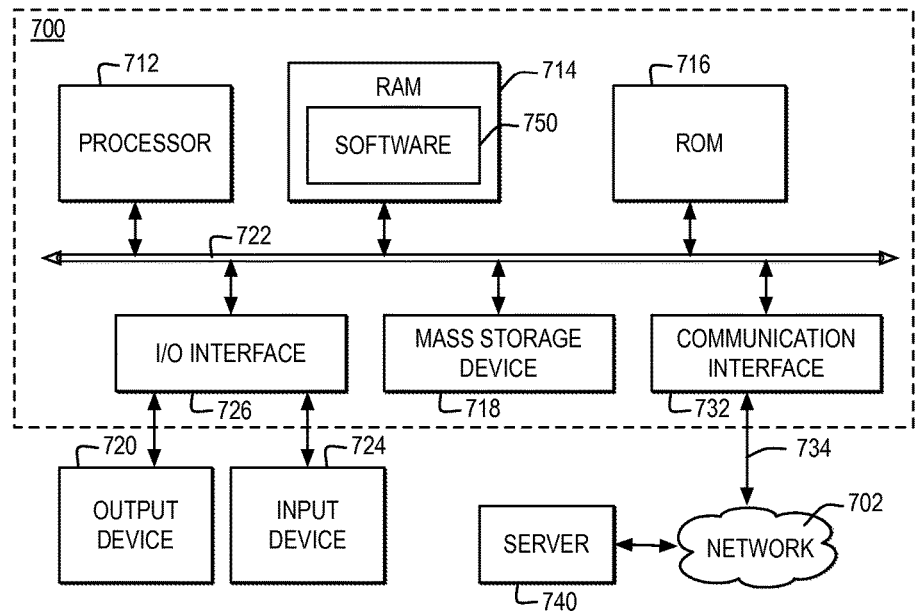
FIG. 7 illustrates a block diagram of one example of a computer system in which one embodiment of the invention may be implemented.

FIG. 7 illustrates a block diagram of one example of a computer system in which one embodiment of the invention may be implemented. The present invention may be performed in a variety of systems and combinations of systems, made up of functional components, such as the functional components described with reference to a computer system 700 and may be communicatively connected to a network, such as network 702.

Computer system 700 includes a bus 722 or other communication device for communicating information within computer system 700, and at least one hardware processing device, such as processor 712, coupled to bus 722 for processing information. Bus 722 preferably includes low-latency and higher latency paths that are connected by bridges and adapters and controlled within computer system 700 by multiple bus controllers. When implemented as a server or node, computer system 700 may include multiple processors designed to improve network servicing power. Where multiple processors share bus 722, additional controllers (not depicted) for managing bus access and locks may be implemented. In one example, one or more components of computer system 700 may be integrated into an electronic assembly.

Processor 712 may be at least one general-purpose processor that, during normal operation, processes data under the control of software 750, which may include at least one of application software, an operating system, middleware, and other code and computer executable programs accessible from a dynamic storage device such as random access memory (RAM) 714, a static storage device such as Read Only Memory (ROM) 716, a data storage device, such as mass storage device 718, or other data storage medium. Software 750 may include, but is not limited to, code, applications, protocols, interfaces, and processes for controlling one or more systems within a network including, but not limited to, an adapter, a switch, a server, a cluster system, and a grid environment.

Computer system 700 may communicate with a remote computer, such as server 740, or a remote client. In one example, server 740 may be connected to computer system 700 through any type of network, such as network 702, through a communication interface, such as network interface 732, or over a network link that may be connected, for example, to network 702.

In the example, multiple systems within a network environment may be communicatively connected via network 702, which is the medium used to provide communications links between various devices and computer systems communicatively connected. Network 702 may include permanent connections such as wire or fiber optics cables and temporary connections made through telephone connections and wireless transmission connections, for example, and may include routers, switches, gateways and other hardware to enable a communication channel between the systems connected via network 702. Network 702 may represent one or more of packet-switching based networks, telephony based networks, broadcast television networks, local area and wire area networks, public networks, and restricted networks.

Network 702 and the systems communicatively connected to computer 700 via network 702 may implement one or more layers of one or more types of network protocol stacks which may include one or more of a physical layer, a link layer, a network layer, a transport layer, a presentation layer, and an application layer. For example, network 702 may implement one or more of the Transmission Control Protocol/Internet Protocol (TCP/IP) protocol stack or an Open Systems Interconnection (OSI) protocol stack. In addition, for example, network 702 may represent the worldwide collection of networks and gateways that use the TCP/IP suite of protocols to communicate with one another. Network 702 may implement a secure HTTP protocol layer or other security protocol for securing communications between systems.

In the example, network interface 732 includes an adapter 734 for connecting computer system 700 to network 702 through a link and for communicatively connecting computer system 700 to server 740 or other computing systems via network 702. Although not depicted, network interface 732 may include additional software, such as device drivers, additional hardware and other controllers that enable communication. When implemented as a server, computer system 700 may include multiple communication interfaces accessible via multiple peripheral component interconnect (PCI) bus bridges connected to an input/output controller, for example. In this manner, computer system 700 allows connections to multiple clients via multiple separate ports and each port may also support multiple connections to multiple clients.

Figure 8:
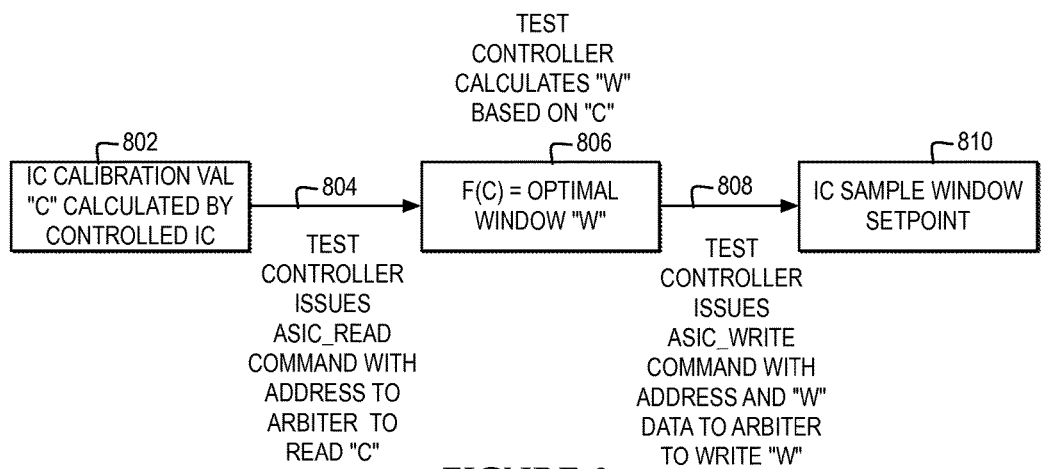
FIG. 8 illustrates a block diagram of one example of components of a nondeterministic test protected within a closed loop architecture test flow controlled by a design entity and performed by testing equipment controlled by a vendor entity.

In one embodiment, the operations performed by processor 712 may control the operations of flowchart of FIG. 8 and other operations described herein. Operations performed by processor 712 may be requested by software 750 or other code or the steps of one embodiment of the invention might be performed by specific hardware components that contain hardwired logic for performing the steps, or by any combination of programmed computer components and custom hardware components. In one embodiment, one or more components of computer system 700, or other components, which may be integrated into one or more components of computer system 700, may contain hardwired logic for performing the operations of flowcharts in FIG. 9.

In addition, computer system 700 may include multiple peripheral components that facilitate input and output. These peripheral components are connected to multiple controllers, adapters, and expansion slots, such as input/output (I/O) interface 726, coupled to one of the multiple levels of bus 722. For example, input device 724 may include, for example, a microphone, a video capture device, an image scanning system, a keyboard, a mouse, or other input peripheral device, communicatively enabled on bus 722 via I/O interface 726 controlling inputs. In addition, for example, output device 720 communicatively enabled on bus 722 via I/O interface 726 for controlling outputs may include, for example, one or more graphical display devices, audio speakers, and tactile detectable output interfaces, but may also include other output interfaces. In alternate embodiments of the present invention, additional or alternate input and output peripheral components may be added.

With respect to FIG. 7, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Those of ordinary skill in the art will appreciate that the hardware depicted in FIG. 7 may vary. Furthermore, those of ordinary skill in the art will appreciate that the depicted example is not meant to imply architectural limitations with respect to the present invention.

FIG. 8 illustrates a block diagram of an example of components of a nondeterministic test protected within a closed loop architecture test flow controlled by a design entity and performed by testing equipment controlled by a vendor entity.

In one example, a controlled IC of a device under test may include an integrated calibration function that allows the controlled IC to calculate a delay on a critical timing path, as illustrated at reference numeral 802. In one example, the calculated delay on a critical timing path may be referred to as "c" and the controlled IC may store "c" at a particular address. In one example, the integrated calibration function allows for selecting an optimal set point over a wide range of process variation in the controlled IC. As a result, the calculated "c" may be different for each run on a particular controlled IC and may also be different across different controlled ICs on different devices under test.

In order to properly configure a particular controlled IC, the delay value "c" must be read from the controlled IC. In one example, as illustrated at reference numeral 804, test controller 210 may send an ASIC_READ request to arbiter 222 to read delay value "c" from a particular address of controlled IC, wherein arbiter 222 is only made aware of a read request and an address to read from, but is not made aware that the data being read by test controller 210 is the delay value "c". Once test controller 210 receives the return data from arbiter 222 in response to the ASIC READ request, test controller 210 may apply a function "F(c)" to "c" to calculate an optimum sampling window for the particular controlled IC. As illustrated at reference numeral 806, the function "F(c)" may calculate an optimal sampling window for a calibration value and produce an optimum sampling window referred to as 'optimal window "w"'. In one example, as illustrated at reference numeral 808, test controller 210 may then send an ASIC_WRITE request to arbiter 222 to write the value "w" to one or more registers of the controlled IC that are responsible for configuring the sample window are updated based on the output of "w", wherein arbiter 222 is only made aware of a write request, the data to write, and one or more addresses to write to. As illustrated at reference numeral 810, the controlled IC uses the written value to set an IC sample window setpoint.

In the example, the function "F(c)", which is performed by test controller 210, may be a test that design entity 120 does not want to disclose to vendor entity 130. In the example, the identity of the process of "F(c)" and the functionality of the process of "F(c)" remains protected within closed loop architecture test flow 212, where only the raw register inputs and outputs are surfaced between test controller 210 and arbiter 222.

In the example, the function "F(c)" is provided as an example of a type of nondeterministic test function protected within closed loop architecture test flow 212. In additional or alternate examples, additional or alternates types of nondeterministic test functions may be implemented.

FIG. 9 illustrates a high level logic flowchart of a process and program for controlling a nondeterministic testing process for calibration controlled by a design entity and performed by testing equipment controlled by a vendor entity.

In one example, the process and program starts at block 900 and thereafter proceeds to block 902. Block 902 illustrates a test controller running a calibration procedure of a selection of read and write commands on the controlled IC, where the test controller runs the read and write commands by sending the read and write commands from the test controller controlled by a design entity to a vendor test platform controlled by a vendor entity, where the vendor test platform runs the commands on an electronic assembly integrating the controlled IC. In one example, the read and write commands represent ASIC_READ and ASIC_WRITE commands, as described with reference to FIG. 6. In one example, the ASIC_READ and ASIC_WRITE commands are specified by a calibration procedure executed by the test controller. Next, block 904 illustrates the test controller polling the vendor test platform for responses indicating completion of the read and write commands. In one example, polling for completion may include performing an ASIC_READ commands until an expected condition occurs or an ASIC_READ command fails. Thereafter, block 906 illustrates the test controller determining whether the completion poll passes. If the completion poll passes, then the process passes to block 908. If the completion poll fails, then an error is detected and the process ends.

Block 908 illustrates the test controller reading a range of registers containing nondeterministic clock skew values collected from the results of the calibration procedure. In one example, the values returned to the test controller in response to a read command represent nondeterministic clock skew values read from one or more cells organized within the controlled IC, through a secondary communication interface which enables reading the values of hidden pins of the controlled IC. Next, block 910 illustrates the test controller extracting and formatting the skew values read from the registers. Thereafter, block 912 illustrates the test controller identifying a setting for the particular card configuration of the device under test. Next, block 914 illustrates the test controller looking up or calculating the optimum de-skew delay values to offset the skew based on product data and data read from the calibration clock skew values. Thereafter, block 916 illustrates the test controller formatting and applying the optimum de-skew delay values to a selection of configuration registers. Next, block 918 illustrates the test controller writing the configuration register values to the controlled IC using write commands, and the process may end. In another example, the process illustrated in FIG. 9 may include additional read and write commands and perform additional analysis.

FIG. 10 illustrates a high level logic flowchart of a process and program for controlling a nondeterministic testing process controlled by a design entity and performed by testing equipment controlled by a vendor entity.

In one example, the process and program starts at block 1000 and thereafter proceeds to block 1002. Block 1002 illustrates sending at least one closed type command of a closed loop architecture test flow to an arbiter of a vendor test platform. Next, block 1004 illustrates a determination whether at least one response is received from the arbiter for the closed type command. At block 1004, when a response is received from the arbiter for the closed type command, the process passes to block 1006. Block 1006 illustrates determining, based on the at least one response and an expected result, a next at least one closed type command of the closed loop architecture test flow to send to the arbiter. If there is a next at least one closed type command determined for the closed loop architecture test flow, then the process iterates back to block 1002; if no next at least one closed type command is determined, the process ends.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A system for testing a device under test, comprising:
a processor, coupled with a memory, and configured to perform the actions of:
sending, by a test controller controlled by a design entity, at least one closed command of a closed loop architecture test flow, to an arbiter of a vendor test platform controlled by a vendor entity, wherein the test controller controls testing of the closed loop architecture test flow on a protected integrated circuit (IC) integrated into an electronic assembly, as performed by test equipment hardware within the vendor test platform, wherein an input and output of the closed loop architecture test flow are nondeterministic, wherein the at least one closed command does not disclose an underlying design of the protected IC to the vendor entity;
controlling, by the design entity, the closed loop architecture test flow for testing the protected IC integrated into the electronic assembly under test, such that the design entity controls running the at least one closed command sent by the closed loop architecture test flow, on the test equipment hardware, without disclosing the underlying design of the protected IC to the vendor entity, wherein the design entity discloses an arbiter specification to the vendor entity comprising an instruction for passing the at least one closed command to a secondary communication interface of the protected IC without interpretation, wherein the design entity is not required to specify the closed loop architecture test flow for controlling a specific environment of the test equipment hardware;
in response to the test controller receiving at least one response to the at least one closed command, from the arbiter passing the at least one closed command directly through the test equipment hardware to the protected IC, determining, by the test controller, based on a result of the testing of the at least one closed command in the at least one response, a next at least one closed command of the closed loop architecture test flow to send to the arbiter; and sending, by the test controller, the next at least one closed command to the arbiter.

2. The system according to claim 1, wherein the processor is further configured to perform the actions of:

sending, by the test controller controlled by the design entity, the at least one closed command comprising at least one of a read command and a write command.

3. The system according to claim 2, wherein the processor is further configured to perform the actions of:

sending, by the test controller controlled by the design entity, the at least one closed command comprising the at least one of the read command and the write command in a format that is translatable by the arbiter into a command passed through a hardware abstraction layer for controlling a hardware layer of the protected IC.

4. The system according to claim 1, wherein the processor is further configured to perform the actions of:

controlling, by the design entity, sending the at least one closed command in a format specified in the arbiter specification to be received by the arbiter and automatically passed through the test equipment hardware to the secondary communication interface comprising a Joint Test Action Group (JTAG) interface of the controlled IC without analysis by the arbiter of contents of the at least one closed command.

5. The system according to claim 1, wherein the processor is further configured to perform the actions of:

controlling, by the design entity, sending the at least one closed command to the arbiter for the arbiter to automatically pass the at least one closed command to the second communication interface, wherein the protected IC comprises a plurality of first pins and a plurality of second pins, wherein when the protected IC is integrated into the electronic assembly, the first pins are hidden within the electronic assembly and the second pins are accessible as the secondary communication interface.

6. The system according to claim 1, wherein the processor is further configured to perform the actions of:

sending, by the test controller, at least one open type command of a closed loop architecture test flow specifying a function, to the arbiter, wherein the arbiter is specified to analyze the open type command to determine the function specified in the at least one open type command and to control a signal on the electronic assembly for controlling the function, wherein the at least one open type command specifying the function is generic for controlling operation independent of a vendor test equipment hardware specification of the vendor test platform.

7. A computer program product for testing a device under test, the computer program product comprising a non-transitory computer readable storage medium having program instructions embodied therewith, the program instructions executable by a processor to cause the processor to:

send, by a test controller controlled by a design entity, at least one closed command of a closed loop architecture test flow, to an arbiter of a vendor test platform controlled by a vendor entity, wherein the test controller controls testing of the closed loop architecture test flow on a protected integrated circuit (IC) integrated into an electronic assembly, as performed by test equipment hardware within the vendor test platform, wherein an input and output of the closed loop architecture test flow are nondeterministic, wherein the at least one closed command does not disclose an underlying design of the protected IC to the vendor entity;

control, by the design entity, the closed loop architecture test flow for testing the protected IC integrated into the electronic assembly under test, such that the design entity controls running the at least one closed command sent by the closed loop architecture test flow, on the test equipment hardware, without disclosing the underlying design of the protected IC to the vendor entity, wherein the design entity discloses an arbiter specification to the vendor entity comprising an instruction for passing the at least one closed command to a secondary communication interface of the protected IC without interpretation, wherein the design entity is not required to specify the closed loop architecture test flow for controlling a specific environment of the test equipment hardware;

in response to the test controller receiving at least one response to the at least one closed command, from the arbiter passing the at least one closed command directly through the test equipment hardware to the protected IC, determine, by the test controller, based on a result of the testing of the at least one closed command in the at least one response, a next at least one closedcommand of the closed loop architecture test flow to send to the arbiter; and send, by the test controller, the next at least one closed command to the arbiter.

8. The computer program product according to claim 7, further comprising the program instructions executable by a processor to cause the processor to:

send, by the test controller controlled by the design entity, the at least one closed command comprising at least one of a read command and a write command.

9. The computer program product according to claim 7, further comprising the program instructions executable by a processor to cause the processor to:

control, by the design entity, sending the at least one closed command in a format specified in the arbiter specification to be received by the arbiter and automatically passed through the test equipment hardware to the secondary communication interface comprising a Joint Test Action Group (JTAG) interface of the controlled IC without analysis by the arbiter of contents of the at least one closed command.

10. The computer program product according to claim 7, further comprising the program instructions executable by a processor to cause the processor to:

control, by the design entity, sending the at least one closed command to the arbiter for the arbiter to automatically pass the at least one closed command to the second communication interface, wherein the protected IC comprises a plurality of first pins and a plurality of second pins, wherein when the protected IC is integrated into the electronic assembly, the first pins are hidden within the electronic assembly and the second pins are accessible as the secondary communication interface.

11. The computer program product according to claim 7, further comprising the program instructions executable by a processor to cause the processor to:

sending, by the test controller, at least one open type command of a closed loop architecture test flow specifying a function, to the arbiter, wherein the arbiter is specified to analyze the open type command to determine the function specified in the at least one open type command and to control a signal on the electronic assembly for controlling the function, wherein the at least one open type command specifying the function is generic for controlling operation independent of a vendor test equipment hardware specification of the vendor test platform.

\* \* \* \* \*